US006965759B2

(12) United States Patent
Aoki

(10) Patent No.: US 6,965,759 B2
(45) Date of Patent: Nov. 15, 2005

(54) FREQUENCY SYNTHESIZER CAPABLE OF OBTAINING SIGNALS IN THREE FREQUENCY BANDS

(75) Inventor: Kazuharu Aoki, Fukushima-ken (JP)

(73) Assignee: Alps Electric Co., Ltd., Tokyo (JP)

(*) Notice: Subject to any disclaimer, the term of this patent is extended or adjusted under 35 U.S.C. 154(b) by 695 days.

(21) Appl. No.: 09/948,833

(22) Filed: Sep. 6, 2001

(65) Prior Publication Data
US 2002/0028667 A1 Mar. 7, 2002

(30) Foreign Application Priority Data
Sep. 7, 2000 (JP) .............................. 2000-276623

(51) Int. Cl.[7] .............................................. H04B 1/18
(52) U.S. Cl. .................... 455/183.1; 455/260; 327/156
(58) Field of Search ............................. 455/76, 86, 78, 455/260, 161.1, 183.1, 183.2; 327/156

(56) References Cited

U.S. PATENT DOCUMENTS

| | | | |
|---|---|---|---|
| 6,178,320 B1 * | 1/2001 | Richards et al. ............ 455/326 |
| 6,188,289 B1 * | 2/2001 | Hyeon ......................... 331/17 |
| 6,516,184 B1 * | 2/2003 | Damgaard et al. ............ 455/86 |
| 6,625,435 B1 * | 9/2003 | Ramesh ....................... 455/313 |
| 6,768,902 B1 * | 7/2004 | Kajita ......................... 455/313 |

FOREIGN PATENT DOCUMENTS

JP 9-148926 6/1997

* cited by examiner

Primary Examiner—Fan Tsang
Assistant Examiner—Aung T. Win
(74) Attorney, Agent, or Firm—Brinks Hofer Gilson & Lione

(57) ABSTRACT

A frequency synthesizer includes a first oscillator that outputs a first oscillation signal. A first phase shifter outputs two first signals which are out of phase by 90°. A second oscillator outputs a second oscillation signal. A second phase shifter outputs two second signals which are out of phase by 90°. To a first mixer, one of the first signals and one of the second signals are input. To a second mixer, the other one of the first signals and the other one of the second signals are input. An adder adds combined outputs from the first and second mixers. A phase switching device changes the phase relationship between the two first signals or the two second signals input to the first mixer and the second signal. An input allowing/prohibiting switching device allows or prohibits the second signals from being input to the first and second mixers. The adder outputs one of a signal at the same frequency as that of the first oscillation signal, a signal at the sum frequency of the frequencies of the first oscillation signal and the second oscillation signal, and a signal at the difference frequency between the frequencies of the first oscillation signal and the second oscillation signal.

20 Claims, 4 Drawing Sheets

FREQUENCY SYNTHESIZER CAPABLE OF OBTAINING SIGNALS IN THREE FREQUENCY BANDS

This application claims the benefit of priority to Japanese Patent Application 2000-276623, filed on Sep. 7, 2000.

BACKGROUND OF THE INVENTION

1. Field of the Invention

The present invention relates to a local oscillator suitable for use in a multifunction-compliant cellular phone such as a recently-developed cellular phone which complies with a plurality of different cellular phone systems and with the global positioning system (GPS) for emergency use.

2. Description of the Related Art

FIG. 5 shows a conventional frequency synthesizer used as a local oscillator. The conventional frequency synthesizer includes a voltage-controlled oscillator 51 and a phase-locked loop (PLL) circuit 52. A resonant line 51b is connected to the base of an oscillation transistor 51a in the voltage-controlled oscillator 51. The resonant line 51b is grounded at various positions via switching diodes 51c and 51d. An oscillation signal is output from the emitter of the oscillation transistor 51a and is input to the PLL circuit 52. A description of the specific structure of the PLL circuit 51 is omitted. The PLL circuit 52 includes therein a phase comparator, a reference oscillator, and the like. The input oscillation signal is compared with a reference frequency, and an error voltage is output. The error voltage is applied as a control voltage for a varactor diode 51e, thereby setting the oscillation frequency. The oscillation frequency is set by frequency data D input to the PLL circuit 51.

The frequency band can be changed by turning on/off the switching diodes 51c and 51d. For example, when the two switching diodes 51c and 51d are turned off, oscillation occurs in the lowest frequency band (approximately 1000 MHz). In order to perform oscillation in the highest frequency band (approximately 1800 MHz), the switching diode 51c is turned on, and the effective length of the resonant line is reduced. In order to perform oscillation in the intermediate frequency band (approximately 1400 MHz), the switching diode 51d is turned on. In any frequency band, the voltage-controlled oscillator 51 is controlled by the PLL circuit 52 to oscillate at predetermined step frequency intervals.

Oscillation signals in each frequency band are used as local oscillation signals for cellular phones which use different systems.

In the above-described conventional example, two switching diodes are used as means for switching the frequency band. Even when the switching diode is turned on, the switching diode has a small resistance. When high frequencies are used as in cellular phones, the effective Q of the resonant line is deteriorated. As a result, the oscillation operation becomes unstable, and the phase noise increases.

SUMMARY OF THE INVENTION

Accordingly, it is an object of the present invention to provide a frequency synthesizer which can obtain signals in three frequency bands using fewer oscillators and in which the frequency can be freely set.

In order to achieve the foregoing objects, according to the present invention, a frequency synthesizer is provided including a first oscillator that outputs a first oscillation signal; a first phase shifter that outputs, in accordance with the first oscillation signal, two first signals which are out of phase by 90; a second oscillator that outputs a second oscillation signal; a second phase shifter that outputs, in accordance with the second oscillation signal, two second signals which are out of phase by 90°; a first mixer to which one of the first signals and one of the second signals are input; a second mixer to which the other one of the first signals and the other one of the second signals are input; an adder that adds the combined outputs from the first mixer and the second mixer; a phase switching device for switching the phase relationship between the two first signals or the two second signals input to the first mixer and the second mixer; and an input allowing/prohibiting switching device for allowing or prohibiting the second signals from being input to the first mixer and the second mixer. The adder outputs one of a signal at the same frequency as that of the first oscillation signal, a signal at the sum frequency of the frequencies of the first oscillation signal and the second oscillation signal, and a signal at the difference frequency between the frequencies of the first oscillation signal and the second oscillation signal.

The phase relationship between the two first signals may be switched by the phase switching device.

The input allowing/prohibiting switching device may be formed of a first make-and-break switch. The first make-and-break switch may be inserted between the second oscillator and the second phase shifter. The second oscillation signal may be input to the second phase shifter through the first make-and-break switch.

The input allowing/prohibiting switching device may be formed of a second make-and-break switch. The power supply voltage may be supplied to the second oscillator and/or the second phase shifter through the second make-and-break switch.

The phase switching device and the input allowing/prohibiting switching device may be formed of a single selector switch. The selector switch may be provided between the second phase shifter and a combination of the first mixer and the second mixer.

The two first signals from the first phase shifter may be produced as balanced output signals. The two second signals from the second phase shifter may be produced as balanced output signals. Each of the first mixer and the second mixer may be formed of a double balanced mixer.

The frequency synthesizer may further include a first pair of pre-amplifier transistors for providing a balanced input of one of the two second signals to the first mixer; and a second pair of pre-amplifier transistors for providing a balanced input of the other one of the two second signals to the second mixer. The input allowing/prohibiting switching device may be formed of a bias voltage selector switch that supplies a bias voltage to each base of the first pair of pre-amplifier transistors and the second pair of pre-amplifier transistors. An unbalanced bias voltage or a balanced bias voltage may be supplied by the bias voltage selector switch to each base of the first pair of pre-amplifier transistors and the second pair of pre-amplifier transistors.

At least the frequency of the second oscillation signal may change at predetermined step frequency intervals within a predetermined range of frequencies, thereby enabling the step frequency to vary.

The frequency of the first oscillation signal may be fixed at 1358 MHz. The frequency of the second oscillation signal may be caused to vary around 391.62 MHz within a range of 60 MHz. When the difference frequency signal is output from the adder, the step frequency may be set to 30 kHz.

When the sum frequency signal is output from the adder, the step frequency may be set to 50 kHz.

According to the present invention, signals in three frequency bands can be obtained, and the frequency of each signal can be freely set. The signals in three frequency bands can be obtained based on whether or not second signals are input to first and second mixers. Whether or not the second signals are input to the first and second mixers can be easily changed. It is also possible to reliably prevent the second signals from being input to the first and second mixers. Phase shift switching and input allowing/prohibiting switching can be made with a simplified structure. High harmonic components output from each mixer can be reduced. With a bias voltage selector switch, it is possible to output one of a signal at the same frequency as that of a first oscillation signal, a signal at the sum frequency of the frequency of the first oscillation signal and the frequency of the second oscillation signal, and a signal at the difference frequency between the frequency of the first oscillation signal and the frequency of the second oscillation signal. The sum frequency signal and the difference frequency signal can be used in local oscillators of different cellular phones. Also, the signals can be used as local oscillation signals in GPS defined by the U.S. Federal Communications Commission (FCC) recommendation E-911, as local oscillation signals in a cellular/automatic message processing system (AMPS) which is a CDMA system in the 800 MHz band used in the U.S.; and as local oscillation signals used in a personal communications services (PCS) system which is a CDMA system in the 1900 MHz band.

DESCRIPTION OF THE PREFERRED EMBODIMENTS

Figure 1:
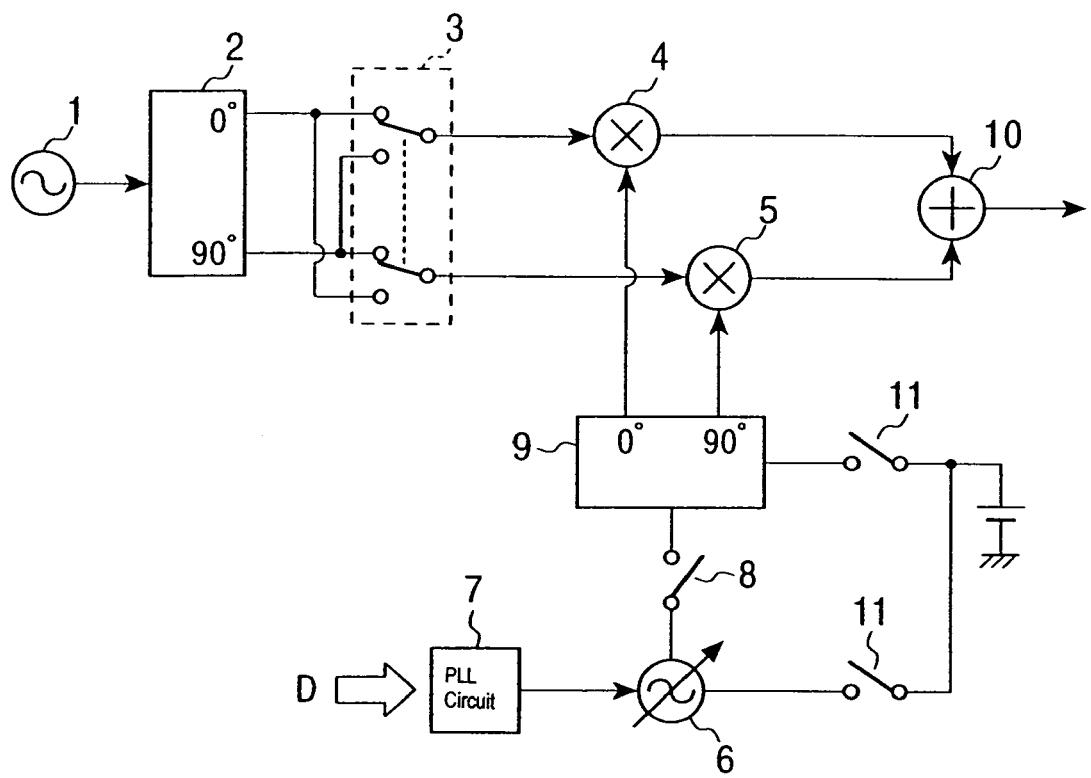
FIG. 1 is a block diagram of a frequency synthesizer according to a first embodiment of the present invention.

A frequency synthesizer according to the present invention is described. FIG. 1 shows a frequency synthesizer according to a first embodiment of the present invention. A first oscillator 1 outputs a first oscillation signal. The frequency of the first oscillation signal may vary. In the first embodiment, the frequency of the first oscillation signal is fixed at 1358 MHz which is used as a local oscillation frequency in GPS which is defined by the U.S. FCC recommendation E-911. In order to enable the oscillation frequency to vary, the first oscillator 1 must be formed of a voltage-controlled oscillator, and the oscillation frequency must be controlled by a PLL circuit (not shown).

The first oscillation signal is input to a first phase shifter 2. In response to the first oscillation signal, the first phase shifter 2 outputs two first signals (sin $\omega_1 t$ and sin($\omega_1 t$+90°)) which are out of phase by 90°(wherein $\omega_1$ is an angular frequency which corresponds to the first oscillation frequency, and sin($\omega_1 t$+90°)=cos $\omega_1 t$.)

The two first signals are separately input through a first phase selector switch 3 to a first mixer 4 and a second mixer 5 which serve as phase switching means. The phase selector switch 3 has a double-pole double-through (DPDT) structure. The phase selector switch 3 reverses the phase relationship between the two first signals which are separately input to the first mixer 4 and the second mixer 5. When one signal (sin $\omega_1 t$) is input to the first mixer 4, the other signal (cos $\omega_1 t$) is input to the second mixer 5. In contrast, when the other signal (cos $\omega_1 t$) is input to the first mixer 4, the one signal (sin $\omega_1 t$) is input to the second mixer 5.

A second oscillator 6 outputs a second oscillation signal. The second oscillator 6 is formed of a voltage-controlled oscillator. The oscillation frequency is changed at 30 kHz intervals or 50 kHz intervals in accordance with frequency data D input to a PLL circuit 7. For example, the center frequency of the oscillation is 391.62 MHz, and the maximum range of variation of the oscillation frequency is approximately 60 MHz (±30 MHz).

The second oscillation signal is input to a second phase shifter 9 through a first make-and-break switch 8 which serves as input allowing/prohibiting switching means. Based on the input second oscillation signal, the second phase shifter 9 outputs two second signals (sin $\omega_2 t$ and sin($\omega_2 t$+90°)) which are out of phase by 90°($\omega_2$ is an angular frequency which corresponds to the second oscillation frequency, and sin($\omega_2 t$+90°)=cos $\omega_2 t$).

The two second signals are separately input to the first mixer 4 and the second mixer 5. Specifically, one signal (sin $\omega_2 t$) is input to the first mixer 4, and the other signal (cos $\omega_2 t$) is input to the second mixer 5.

The mixers 4 and 5 mix the first signal and the second signal and output combined outputs, and the combined outputs are added by an adder 10.

When the first make-and-break switch 8 is closed, the second oscillation signal is input to the second phase shifter 9. With the phase selector switch 3, one signal (sin $\omega_1 t$) of the first signals is input to the first mixer 4, and the other signal (cos $\omega_1 t$) is input to the second mixer 5. The combined output from the first mixer 4 is $-\cos(\omega_1+\omega_2)t+\cos(\omega_1-\omega_2)t$, and the combined output from the second mixer 5 is $\cos(\omega_1+\omega_2)t+\cos(\omega_1-\omega_2)t$.

Figure 2:
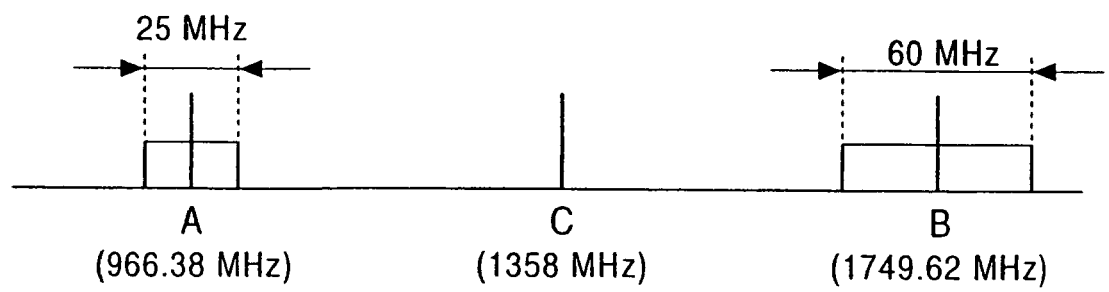
FIG. 2 illustrates the relationships among frequencies in the frequency synthesizer of the present invention.

As shown by A of FIG. 2, the adder 10 outputs the difference frequency signal $\cos(\omega_1-\omega_2)t$ between the frequency of the first oscillation signal and the frequency of the second oscillation signal. If the frequency of the first oscillation signal is 1358 MHz, and the frequency of the second oscillation signal is 391.62 MHz, the center frequency is 966.38 MHz. When the frequency changes at step frequency intervals of 30 kHz within a range of ±12.5 MHz, it can be used as a local oscillation signal in a cellular/AMPS system which is the CDMA system in the 800 MHz band used in the United States.

While the second oscillation signal is being input to the second phase shifter 9, one signal (sin $\omega_1 t$) of the first signals is input to the second mixer 5 by the first selector switch 3, and the other signal (cos $\omega_1 t$) is input to the first mixer 4. As a result, the combined output from the first mixer 4 is $\sin(\omega_1+\omega_2)t-\sin(\omega_1-\omega_2)t$, and the combined output from the second mixer 5 is $\sin(\omega_1+\omega_2)t+\sin(\omega_1+\omega_2)t$.

As shown by B in FIG. 2, the adder 10 outputs the sum frequency signal $\sin(\omega_1+\omega_2)t$ of the frequency of the first oscillation signal and the frequency of the second oscillation signal. When the foregoing frequencies are employed, the center frequency is 1749.62 MHz. When the frequency changes at step frequency intervals of 50 kHz within a range of ±30 MHz, it can be used as a local oscillation signal in the PCS system which is the CDMA system in the 1900 MHz band used in the United States.

When the first make-and-break switch 8 is opened, thereby preventing the second oscillation signal from being input to the second phase shifter 9, only the first signals are input to the first and second mixers 4 and 5. As shown by C in FIG. 2, the adder 10 outputs a signal at the same frequency as the frequency 1358 MHz of the first oscillation signal, which can be used as a local oscillation signal in GPS.

Alternatively, a second make-and-break switch 11 for supplying the power supply voltage to the second oscillator 6 and/or the second phase shifter 9 can be provided, and the second make-and-break switch 11 can be used as input allowing/prohibiting switching means to select whether the second signals are input to the first and second mixers 4 and 5. If the second make-and-break switch 11 is opened, the second oscillator 6 and/or the second phase shifter 9 does not operate, and the second signals are not input to the first and second mixers 4 and 5.

Figure 3:
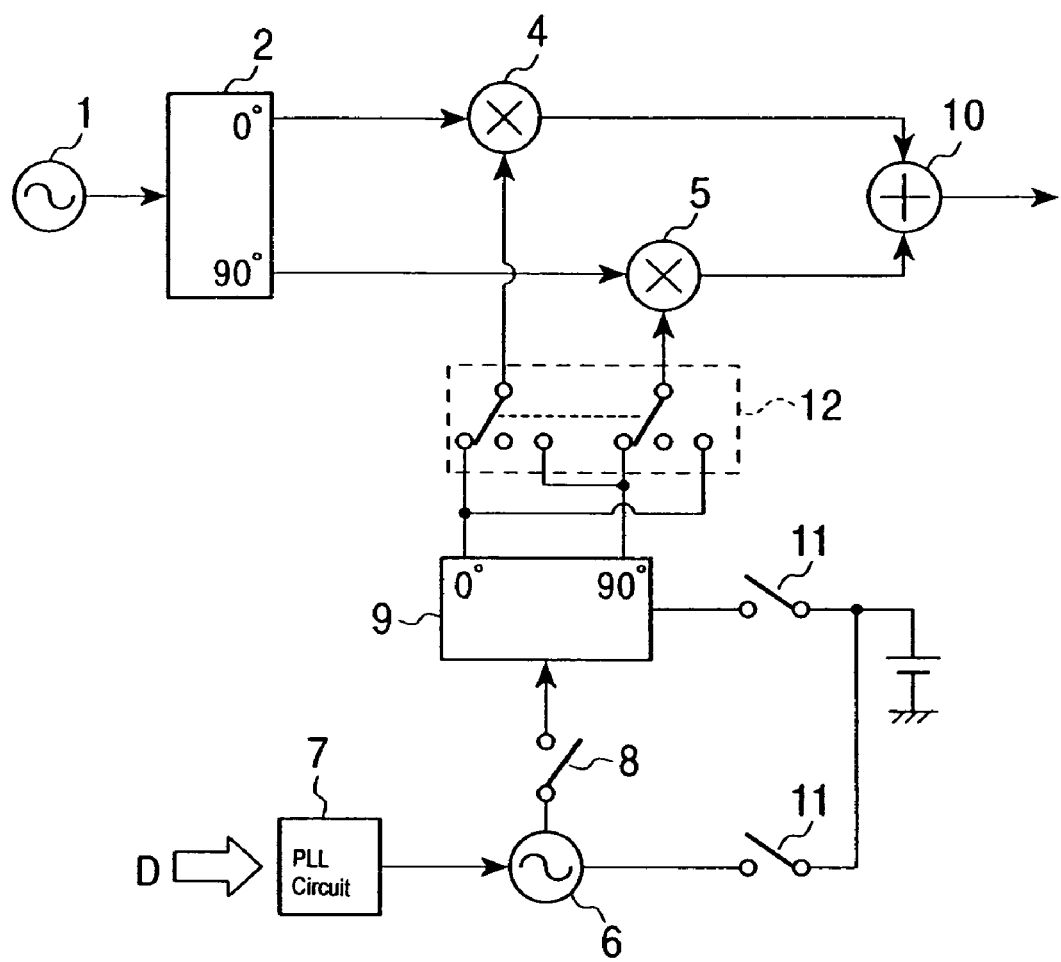
FIG. 3 is a block diagram of a frequency synthesizer according to a second embodiment of the present invention.

FIG. 3 shows a second embodiment of the present invention. The two first signals output from the first phase shifter 2 are separately and directly input to the first and second mixers 4 and 5.

In contrast, the two second signals output from the second phase shifter 9 are input to a second phase selector switch 12. The second phase selector switch 12 has a double-pole triple-through structure. The second selector switch 12 has a function for changing the phase relationship between the two second signals and inputting the two second signals to the first and second mixers 4 and 5 and another function for preventing the second signals from being input to the first and second mixers 4 and 5. Thus, the second phase selector switch 12 has two functions, namely, phase switching means and input allowing/prohibiting switching means.

According to the second embodiment, as shown in FIG. 3, the first make-and-break switch 8 can be provided between the second oscillator 6 and the second phase shifter 9, or the second make-and-break switch 11 for interrupting the supply of the power supply voltage to the second oscillator 6 and/or the second phase shifter 9 can be provided.

In such cases, the adder 10 outputs a signal at the same frequency ($\sin \omega_1 t$) as that of the first oscillation signal, a signal at the sum frequency ($\sin(\omega_1+\omega_2)t$) of the frequencies of the first oscillation signal and the second oscillation signal, or a signal at the difference frequency ($\cos(\omega_1-\omega_2)t$) between the frequencies of the first oscillation signal and the second oscillation signal.

Figure 4:
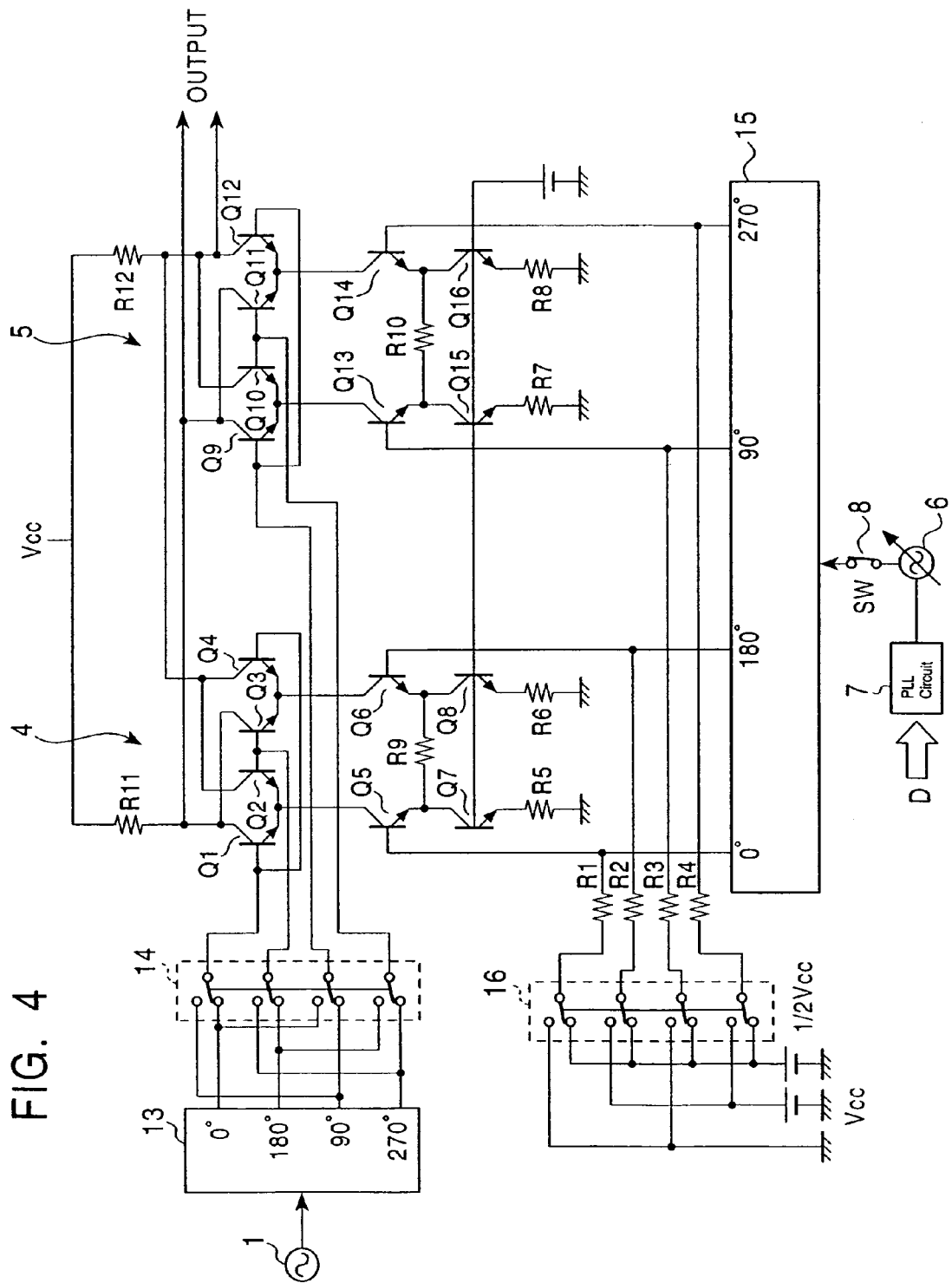
FIG. 4 is a circuit diagram of the frequency synthesizer of the present invention.
Figure 5:
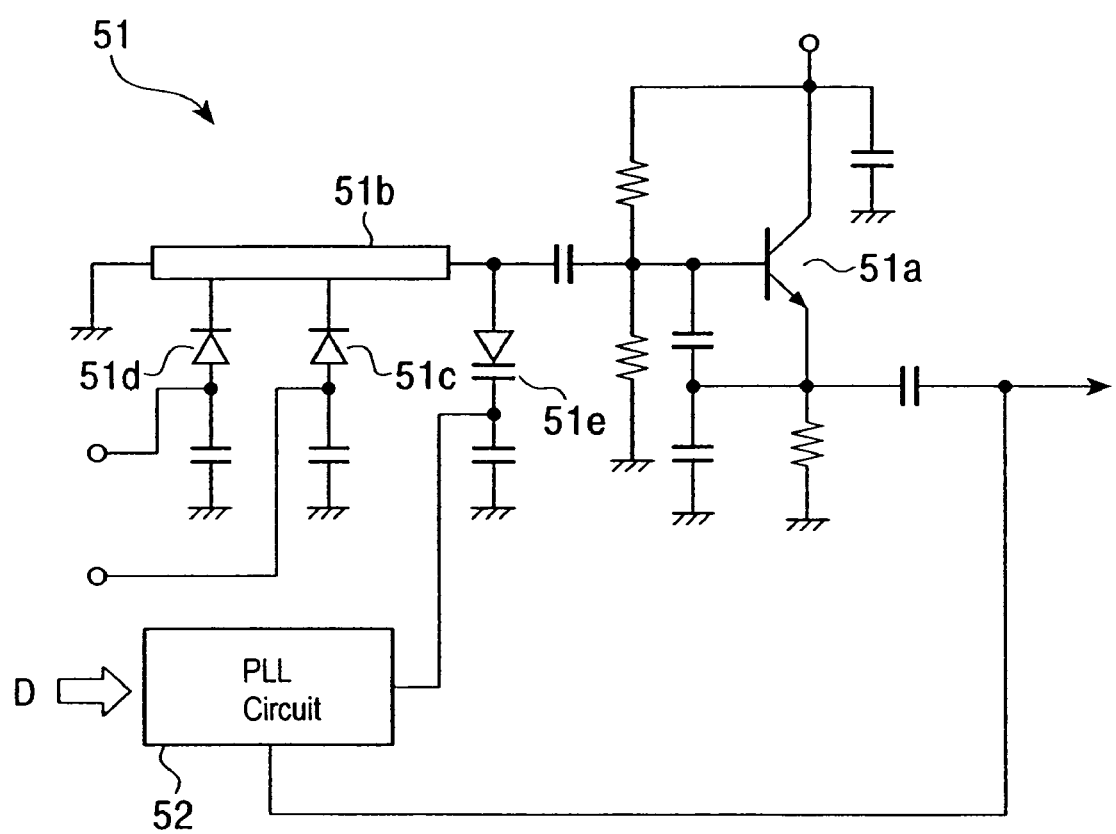
FIG. 5 is a circuit diagram of a conventional frequency synthesizer.

FIG. 4 is a circuit diagram of the specific structure in which the first and second mixers 4 and 5 are formed of a double balanced mixer including transistors. Accordingly, the output sides of the first and second mixers 4 and 5 are balanced, and hence the mixers 4 and 5 output four signals which are shifted in phase by 90° from each other.

The first mixer 4 includes two pairs of differential amplifier transistors (a pair Q1 and Q2 and another pair Q3 and Q4), a pair of pre-amplifier transistors (Q5 and Q6), and a pair of constant-current transistors (Q7 and Q8). Similarly, the second mixer 5 includes two pairs of differential amplifier transistors (a pair Q9 and Q10 and another pair Q11 and Q12), a pair of pre-amplifier transistors (Q13 and Q14), and a pair of constant-current transistors (Q15 and Q16).

In response to the first oscillation signal, a first balanced phase shifter 13 which serves as the first phase shifter 2 balanced-outputs the two first signals which are out of phase by 90°. Through a third phase selector switch 14 which has a quartet-pole double-through structure and which serves as phase switching means, balanced signals (0° and 180°) are input to each base of the differential amplifier transistors (one pair Q1 and Q2 and the other pair Q3 and Q4) of the first mixer 4 or to each base of the differential amplifier transistors (one pair Q9 and Q10 and the other pair Q11 and Q12) of the second mixer 5. Similarly, the other balanced signals (90° and 270°) are input to each base of the differential amplifier transistors (one pair Q9 and Q10 and the other pair Q11 and Q12) of the second mixer 5 or to each base of the differential amplifier transistors (one pair Q1 and Q2 and the other pair Q3 and Q4) of the first mixer 4.

In contrast, in response to the second oscillation signal, a second balanced phase shifter 15 which serves as the second phase shifter 9 balanced-outputs the two second signal which are out of phase by 90°. Balanced signals (0° and 180°) are input to each base of the pair of pre-amplifier transistors (Q5 and Q6) of the first mixer 4. Through each collector of the pre-amplifier transistors (Q5 and Q6), the two second signal are input to each emitter of the differential amplifier transistors (one pair Q1 and Q2 and the other pair Q3 and Q4). The other balanced signals (90° and 270°) are input to each base of the pair of pre-amplifier transistors (Q13 and Q14) of the second mixer 5. Through each collector of the pre-amplifier transistors (Q13 and Q14), the other balanced signals are input to each emitter of the differential amplifier transistors (one pair Q9 and Q10 and the other pair Q11 and Q12).

A balanced bias voltage or an unbalanced bias voltage is applied to each base of the pre-amplifier transistors (Q5, Q6, Q13, and Q14) through a bias voltage selector switch 16 serving as input allowing/prohibiting switching means.

If the power supply voltage applied to the first and second mixers 4 and 5 is Vcc, three bias voltages, namely, 0 volt, ½ Vcc, and Vcc, are prepared. The bias voltage selector switch 16 applies a balanced bias voltage of ½ Vcc to each base of the pre-amplifier transistors (Q5, Q6, Q13, and Q14). Alternatively, the bias voltage selector switch 16 applies an unbalanced bias voltage, that is, 0 volt, to each base of one transistor (Q5 and Q13) of each pair of pre-amplifier transistors (one pair Q5 and Q6 and the other pair Q13 and Q14) and Vcc to the other transistor (Q6 and Q14).

When the balanced bias voltage is applied, bias current flows through two pairs of differential amplifier transistors (one pair Q1 and Q2 and the other pair Q3 and Q4) of the first mixer 4, and the combined output is detected between the collectors of the differential amplifier transistors (Q1 and Q3) and the collectors of the differential amplifier transistors (Q2 and Q4).

Similarly, bias current flows through two pairs of differential amplifier transistors (one pair Q9 and Q10 and the other pair Q11 and Q12) of the second mixer 5, and the combined output is detected between the collectors of the differential amplifier transistors (Q9 and Q11) and the collectors of the differential amplifier transistors (Q10 and Q12).

A common load resistor R11 is connected to the collectors of the differential amplifier transistors (Q1, Q3, Q9, and Q11), and a common load resistor R12 is connected to the collectors of the differential amplifier transistors (Q2, Q4, Q10, and Q12). As a result, the combined outputs are added by the load resistors R11 and R12, thereby outputting a signal at the difference frequency ($\cos(\omega_1-\omega_2)t$) between the frequency of the first oscillation signal and the frequency of the second oscillation signal. Accordingly, the load resistors R11 and R12 function as the adder 10.

By reversing the phase relationship between the two first signals input to the first mixer 4 and the second mixer 5, a signal at the sum frequency ($\sin(\omega_1+\omega_2)t$) of the frequencies of the first oscillation signal and the second oscillation signal is output.

When the above-described unbalanced bias voltages are applied to the bases of the pre-amplifier transistors (Q5, Q6, Q13, and Q14), the bases of the pre-amplifier transistors (Q5, Q6, Q13, and Q14) are grounded at high frequencies, and hence the second signals are not input to the differential amplifier transistors (one pair Q1 and Q2 and the other pair Q9 and Q10). Since no bias current flows through the pre-amplifier transistors (Q5 and Q13), the differential amplifiers (Q3 and Q4) of the first mixer 4 and the differential amplifiers (Q11 and Q12) of the second mixer 5 operate as simple amplifiers, thereby outputting a signal at the same frequency (sin $\omega_1 t$) as that of the first oscillation signal.

As described above, the bias voltage selector switch 16 serves as input allowing/prohibiting switching means.

The first phase selector switch 3, the first make-and-break switch 8, and the second make-and-break switch 11, which are shown in FIG. 1, the second phase selector switch 12 shown in FIG. 3, and the third phase shifter switch 14 and the bias voltage selector switch 16 shown in FIG. 4 can be formed of mechanical switches or selector switches. Alternatively, the switches can be formed as circuits using semiconductor switching devices.

What is claimed is:

1. A frequency synthesizer comprising:
   a first oscillator that outputs a first oscillation signal;
   a first phase shifter that outputs, in accordance with the first oscillation signal, two first signals which are out of phase by 90°;
   a second oscillator that outputs a second oscillation signal;
   a second phase shifter that outputs, in accordance with the second oscillation signal, two second signals which are out of phase by 90°;
   a first mixer to which one of the first signals and one of the second signals are input;
   a second mixer to which the other one of the first signals and the other one of the second signals are input;
   an adder that adds an output from said first mixer and said second mixer;
   a phase switch that switches a phase relationship between the two first signals or the two second signals input to said first mixer and said second mixer; and
   an input allowing/prohibiting switch that one of allows and prohibits the second signals from being input to said first mixer and said second mixer;
   wherein said adder selectively outputs one of a signal at a same frequency as that of the first oscillation signal, a signal at a sum frequency of the frequencies of the first oscillation signal and the second oscillation signal, and a signal at a difference frequency between the frequencies of the first oscillation signal and the second oscillation signal.

2. A frequency synthesizer according to claim 1, wherein the phase relationship between the two first signals is switched by said phase switch.

3. A frequency synthesizer according to claim 1, wherein said input allowing/prohibiting switch is formed of a first make-and-break switch;
   the first make-and-break switch is inserted between said second oscillator and said second phase shifter; and
   the second oscillation signal is input to said second phase shifter through the first make-and-break switch.

4. A frequency synthesizer according to claim 1, wherein said input allowing/prohibiting switch is formed of a second make-and-break switch; and
   the power supply voltage is supplied to one of said second oscillator and said second phase shifter through the second make-and-break switch.

5. A frequency synthesizer according to claim 1, wherein said phase switch and said input allowing/prohibiting switch are formed of a single selector switch; and
   the selector switch is provided between said second phase shifter and a combination of said first mixer and said second mixer.

6. A frequency synthesizer according to claim 1, wherein the two first signals from said first phase shifter are produced as balanced output signals;
   the two second signals from said second phase shifter are produced as balanced output signals; and
   said first mixer and said second mixer are each formed of a double balanced mixer.

7. A frequency synthesizer according to claim 6, further comprising:
   a first pair of pre-amplifier transistors to provide a balanced input of one of the two second signals to said first mixer; and
   a second pair of pre-amplifier transistors to provide a balanced input of the other one of the two second signals to said second mixer;
   wherein said input allowing/prohibiting switch is formed of a bias voltage selector switch that supplies a bias voltage to each base of said first pair of pre-amplifier transistors and said second pair of pre-amplifier transistors; and
   one of an unbalanced bias voltage and a balanced bias voltage is supplied by the bias voltage selector switch to each base of said first pair of pre-amplifier transistors and said second pair of pre-amplifier transistors.

8. A frequency synthesizer according to claim 1, wherein at least the frequency of the second oscillation signal changes at predetermined step frequency intervals within a predetermined range of frequencies, thereby enabling the step frequency to vary.

9. A frequency synthesizer according to claim 8, wherein:
   the frequency of the first oscillation signal is fixed at 1358 MHz;
   the frequency of the second oscillation signal varies around 391.62 MHz within a range of 60 MHz;
   when the difference frequency signal is output from said adder, the step frequency is set to 30 kHz; and
   when the sum frequency signal is output from said adder, the step frequency is set to 50 kHz.

10. A frequency synthesizer according to claim 1, wherein the phase switch is disposed between one of the first and second phase shifters and the first and second mixers.

11. A frequency synthesizer according to claim 2, wherein the phase switch is disposed between the first phase shifter and the first and second mixers.

12. A frequency synthesizer according to claim 1, wherein the input allowing/prohibiting switch allows or prohibits only the second signals from being input to the first mixer and the second mixer.

13. A frequency synthesizer comprising:
   a first oscillator that outputs a first oscillation signal;
   a first phase shifter that outputs, in accordance with the first oscillation signal, two first signals which are out of phase by 90°;
   a second oscillator that outputs a second oscillation signal;
   a second phase shifter that outputs, in accordance with the second oscillation signal, two second signals which are out of phase by 90°;

a first mixer to which one of the first signals and one of the second signals are input;

a second mixer to which the other one of the first signals and the other one of the second signals are input;

an adder that adds an output from the first mixer and the second mixer;

a phase switch that switches a phase relationship between the two first signals or the two second signals input to the first mixer and the second mixer; and an input allowing/prohibiting switch that allows or prohibits only the second signals from being input to the first mixer and the second mixer by making/breaking a connection between the second oscillator and the second phase shifter or a connection between a power supply and at least one of the second oscillator and the second phase shifter;

wherein the adder selectively outputs one of a signal at a same frequency as that of the first oscillation signal, a signal at a sum frequency of the frequencies of the first oscillation signal and the second oscillation signal, and a signal at a difference frequency between the frequencies of the first oscillation signal and the second oscillation signal.

14. A frequency synthesizer according to claim 13, wherein the input allowing/prohibiting switch makes/breaks the connection between the second oscillator and the second phase shifter.

15. A frequency synthesizer according to claim 13, wherein the input allowing/prohibiting switch makes/breaks the connection between the power supply and both the second oscillator and the second phase shifter.

16. A frequency synthesizer according to claim 1, wherein the two first signals from the first phase shifter are produced as balanced output signals;

the two second signals from the second phase shifter are produced as balanced output signals; and the first mixer and the second mixer are each formed of a double balanced mixer.

17. A frequency synthesizer according to claim 16, further comprising:

a first pair of pre-amplifier transistors to provide a balanced input of one of the two second signals to the first mixer; and a second pair of pre-amplifier transistors to provide a balanced input of the other one of the two second signals to the second mixer;

wherein the input allowing/prohibiting switch is formed of a bias voltage selector switch that supplies a bias voltage to each base of the first pair of pre-amplifier transistors and the second pair of pre-amplifier transistors; and one of an unbalanced bias voltage and a balanced bias voltage is supplied by the bias voltage selector switch to each base of the first pair of pre-amplifier transistors and the second pair of pre-amplifier transistors.

18. A frequency synthesizer according to claim 13, wherein at least the frequency of the second oscillation signal changes at predetermined step frequency intervals within a predetermined range of frequencies, thereby enabling the step frequency to vary.

19. A frequency synthesizer according to claim 13, wherein the phase switch is disposed between one of the first and second phase shifters and the first and second mixers.

20. A frequency synthesizer according to claim 13, wherein the phase switch is disposed between the first phase shifter and the first and second mixers, and the phase relationship between the two first signals is switched by the phase switch.

* * * * *